US006686265B2

(12) United States Patent
Beitel et al.

(10) Patent No.: US 6,686,265 B2
(45) Date of Patent: Feb. 3, 2004

(54) METHOD OF PRODUCING A CAPACITOR ELECTRODE WITH A BARRIER STRUCTURE

(75) Inventors: Gerhard Beitel, Kamakura (JP); Annette Sänger, Dresden (DE); Igor Kasko, Fishkill, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/127,618

(22) Filed: Apr. 22, 2002

(65) Prior Publication Data

US 2002/0151162 A1 Oct. 17, 2002

Related U.S. Application Data

(63) Continuation of application No. PCT/DE00/03662, filed on Oct. 16, 2000.

(30) Foreign Application Priority Data

Oct. 20, 1999 (DE) .......................... 199 50 540

(51) Int. Cl.⁷ .............................................. H01L 21/44
(52) U.S. Cl. ..................... 438/597; 438/3; 438/240; 438/253; 438/254; 438/393; 438/396; 438/637; 438/681
(58) Field of Search ............................... 438/597, 3, 240, 438/253, 254, 393, 396, 637, 681

(56) References Cited

U.S. PATENT DOCUMENTS

| 5,366,920 A | | 11/1994 | Yamaichi et al. | |
|---|---|---|---|---|
| 5,392,189 A | | 2/1995 | Fazan et al. | |
| 5,498,561 A | | 3/1996 | Sakuma et al. | |
| 5,612,574 A | * | 3/1997 | Summerfelt et al. | ........ 257/783 |
| 5,739,563 A | | 4/1998 | Kawakubo et al. | |
| 5,793,057 A | | 8/1998 | Summerfelt | |
| 5,953,609 A | * | 9/1999 | Koyama et al. | ............. 438/253 |
| 5,959,327 A | | 9/1999 | Sandhu et al. | |
| 6,022,798 A | * | 2/2000 | Sumi et al. | ................. 438/637 |
| 6,043,561 A | * | 3/2000 | Katori et al. | ................ 257/751 |
| 6,130,124 A | * | 10/2000 | Lee | ............................. 438/240 |
| 6,190,963 B1 | * | 2/2001 | Zhang et al. | ............... 438/254 |
| 6,235,603 B1 | * | 5/2001 | Melnick et al. | ............. 438/393 |
| 6,239,461 B1 | * | 5/2001 | Lee | ............................. 257/306 |
| 6,271,077 B1 | * | 8/2001 | Nakabayashi et al. | ...... 438/240 |
| 6,271,131 B1 | * | 8/2001 | Uhlenbrock et al. | ........ 438/681 |
| 6,274,899 B1 | * | 8/2001 | Melnick et al. | ............. 257/298 |
| 6,335,241 B1 | * | 1/2002 | Hieda et al. | ............... 438/253 |
| 6,351,005 B1 | * | 2/2002 | Al-Shareef et al. | ......... 257/306 |
| 6,376,325 B1 | * | 4/2002 | Koo | .......................... 438/396 |
| 6,380,574 B1 | * | 4/2002 | Torii et al. | .................. 257/295 |
| 6,407,422 B1 | * | 6/2002 | Asano et al. | ................ 257/306 |

FOREIGN PATENT DOCUMENTS

| EP | 0 488 283 A2 | 6/1992 |
|---|---|---|
| EP | 0 834 912 A2 | 4/1998 |
| EP | 0 838 852 A2 | 4/1998 |
| EP | 1 017 096 A2 | 7/2000 |
| WO | WO 99/27581 | 6/1999 |

* cited by examiner

*Primary Examiner*—Michael S. Lebentritt
*Assistant Examiner*—Michael K. Luhrs
(74) *Attorney, Agent, or Firm*—Laurence A. Greenberg; Werner H. Stemer; Ralph E. Locher

(57) ABSTRACT

A capacitor electrode is produced with an underlying barrier structure. A barrier incorporation layer is used and a CMP (chemical mechanical polishing) process is employed in order to produce the barrier structure. The capacitor electrode with an underlying barrier structure is produced by depositing a barrier layer on a semiconductor substrate; forming a barrier structure from the barrier layer with a lithographic mask and an etching step; depositing a barrier incorporation layer covering the barrier structure and surrounding regions; and removing the barrier incorporation layer with chemical mechanical polishing until the barrier structure is uncovered, to thereby form the capacitor electrode above the barrier structure.

17 Claims, 7 Drawing Sheets

METHOD OF PRODUCING A CAPACITOR ELECTRODE WITH A BARRIER STRUCTURE

CROSS-REFERENCE TO RELATED APPLICATION

This application is a continuation of copending International Application No. PCT/DE00/03662, filed Oct. 16, 2000, which designated the United States.

BACKGROUND OF THE INVENTION

Field of the Invention

The invention relates to a method for production of a capacitor electrode with an underlying barrier structure in an integrated semiconductor circuit.

The space offered for capacitors in integrated semiconductor circuits, in particular memory circuits, decreases as the integration density increases. In order nevertheless to obtain capacitors having a high capacitance, it has become known to use so-called high-∈ dielectrics as capacitor dielectric. A further objective currently consists in the development of nonvolatile memories (FeRAM) which use ferroelectrics as capacitor material.

These novel capacitor materials generally have to be produced at relatively high process temperatures and using an oxygen-containing process gas. With the use of an oxidizable electrode (for example of polysilicon or tungsten), this would lead to oxidation of the electrode and a resultant decrease in the capacitance of the capacitor. Therefore, it is also necessary to use novel, inert electrode materials, such as e.g. Pt, Ir, Ru.

When such electrode materials are used, there is a problem in that the oxygen diffuses through the chemically stable electrode and a high-resistance blocking oxide layer then builds up at the silicon substrate. In order to prevent this, use is made of a barrier between the electrode and the substrate.

The barrier and also the overlying bottom electrode of the capacitor are usually produced by multiply performing suitable photolithography and etching processes.

A method for production of a thin-film capacitor is described in U.S. Pat. No. 5,366,920. There, the barrier and also the bottom electrode are not produced by a photolithography and etching process, rather an insulation layer is deposited on the substrate, and an opening is introduced into said insulation layer. Afterward, the opening is filled by depositing a barrier layer, an electrode layer, and further layers. In this way, the capacitor is built up layer by layer in the opening of the insulation layer.

U.S. Pat. No. 5,498,561 (European application EP 0 488 283 A2) discloses a memory cell in an integrated circuit. On a substrate, there are arranged a word line and a bit line, and an insulation layer is deposited. A contact-making hole to a drain region of a transistor and a bottom electrode of a capacitor is formed in the insulation layer. A barrier layer is formed above said electrode, said barrier layer being intended to prevent the occurrence of leakage currents which can occur between capacitor electrodes particularly in the case of very thin dielectric layers, particularly in the case of silicon oxide or silicon nitride. In order to form the dielectric layer on the surface of the barrier layer, said surface is etched free beforehand by means of a plasma etching step. A top electrode is formed on the dielectric layer, so that both the barrier layer and the dielectric layer are arranged between the two capacitor electrodes.

A further memory device is disclosed in U.S. Pat. No. 5,959,327, wherein a plurality of transistors are formed on a substrate, an insulation layer being deposited on said transistors. Contact holes to drain regions of the transistors are produced in said insulation layer, which are partly filled with polysilicon and serve as "plug". A thin titanium layer is formed on said polysilicon layer and reacts with the silicon of the polysilicon layer to produce a titanium silicide layer, which serves for lowering the contact resistance between the polysilicon and the titanium nitride layer formed on the titanium silicide layer. The titanium nitride layer serves as silican barrier layer. This prevents diffusion of silicon from the polysilicon layer of the "plug" as far as a capacitor formed on the titanium nitride layer and the insulation layer. Before the capacitor is formed, the surface of the titanium nitride layer and of the insulation layer is planarized. The capacitor electrodes are formed horizontally on this planarized surface.

An alternative formation of the capacitor electrodes is described in the U.S. Pat. No. 5,392,189, wherein a further insulation layer is produced on the planarized surface. Holes being etched into the further insulation layer above the silicon barrier layer. The capacitor electrodes with an interposed dielectric layer are formed in a U-shaped manner in the holes.

That configuration of the capacitor electrodes is also disclosed in published international PCT application WO-A 99/27581.

In all of the known devices, the method for production of the capacitor electrodes and the barrier layer is relatively difficult.

SUMMARY OF THE INVENTION

It is accordingly an object of the invention to provide a method of producing capacitor electrode with an underlying barrier structure, which overcomes the above-mentioned disadvantages of the heretofore-known devices and methods of this general type and which can be carried out simply and with process reliability.

With the foregoing and other objects in view there is provided, in accordance with the invention, a method of producing a capacitor electrode with an underlying barrier structure, the method which comprises:

depositing a barrier layer on a semiconductor substrate;

forming a barrier structure from the barrier layer with a lithographic mask and an etching step;

depositing a barrier incorporation layer covering the barrier structure and surrounding regions;

removing the barrier incorporation layer with chemical mechanical polishing until the barrier structure is uncovered; and forming the capacitor electrode above the barrier structure.

An important aspect of the invention is that a CMP (chemical mechanical polishing) planarization step is used to produce the barrier structure. CMP is a process step that is simple to perform in semiconductor technology.

In the above-outlined process, the CMP process is used to produce a planarized surface of the barrier incorporation layer and of the barrier structure incorporated therein. The planarized surface is then used as a support for the capacitor electrode that is subsequently to be constructed.

Preferably, in order to form the capacitor electrode, an electrode incorporation layer is deposited above the planarized barrier structure incorporation layer and an electrode patterning hole, which uncovers the barrier structure, is produced in the electrode incorporation layer by means of a lithographic mask and etching step. A layer made of electrode material which fills the electrode patterning hole is then deposited into and surrounding the electrode patterning hole, and, finally, the capacitor electrode is formed from the electrode material layer by CMP.

Accordingly, CMP planarization steps can thus be used both to produce the "buried" barrier structure and to produce the "bottom" capacitor electrode. In principle, however, it is also possible for a layer deposition step and a lithographic mask and etching step to be used to form the capacitor electrode in a manner known per se.

With the above and other objects in view there is also provided, in accordance with the invention, a method of producing a capacitor electrode with an underlying barrier structure, the method which comprises:

forming an insulation layer with a contact hole on a semiconductor substrate;

depositing a barrier incorporation layer on the insulation layer and the contact hole;

producing a barrier patterning hole in the barrier incorporation layer with a lithographic mask and an etching step;

depositing a barrier layer into and surrounding the barrier patterning hole;

forming the barrier structure from the barrier layer with a CMP planarization step; and forming the capacitor electrode.

According to this alternative embodiment, an insulation layer is deposited onto a semiconductor substrate, a contact hole being formed in said insulation layer. A barrier incorporation layer is deposited on said insulation layer and the contact hole. A barrier patterning hole is produced in said barrier incorporation layer, a barrier layer is deposited into and surrounding the barrier patterning hole and a barrier structure is formed from the barrier layer by means of a CMP planarization. Unlike according to the first aspect of the invention, in this process the CMP planarization step is used directly for (lateral) patterning of the barrier layer.

According to a first embodiment variant, the barrier layer can be deposited in such a way that the barrier patterning hole is completely filled. As a result of the subsequent CMP planarization step, the barrier structure incorporation layer with incorporated barrier structure then acquires a planar surface which can serve as a support for the subsequent construction of the capacitor electrode in the manner already described.

In accordance with an added feature of the invention, the method comprises completely filling the barrier patterning hole during the step of depositing the barrier layer.

In accordance with an additional feature of the invention, the capacitor electrode is formed by:

depositing an electrode incorporation layer above the planarized barrier incorporation layer;

producing an electrode patterning hole, uncovering the barrier structure, in the electrode incorporation layer with a lithographic mask and an etching step;

producing a layer of electrode material completely filling the electrode patterning hole in and surrounding the electrode patterning hole; and forming the capacitor electrode from the electrode material layer by chemical mechanical polishing.

In the alternative, the capacitor electrode is formed by:

depositing a layer of electrode material above the planarized barrier incorporation layer; and forming the capacitor electrode from the electrode material layer with a lithographic mask and an etching step.

In a second embodiment variant, the barrier layer is deposited in such a way that the bottom and wall of the hole are lined while maintaining a depression. A layer made of electrode material is deposited above the barrier layer. During the subsequent CMP patterning of the barrier layer, the capacitor electrode is simultaneously formed from the overlying electrode material layer. In this embodiment variant, it is advantageous that overall only one photolithography step is sufficient, as a result of which the entire process can be carried out very cost-effectively and in a manner that saves time.

In accordance with another feature of the invention, the upper layer of the contact layer structure is composed of Ir and/or the lower layer of the contact layer structure is composed of Ti.

In accordance with a further feature of the invention, the barrier layer is composed of $IrO_2$.

In accordance with a concomitant feature of the invention, the electrode material layer is composed of Pt.

Other features which are considered as characteristic for the invention are set forth in the appended claims.

Although the invention is illustrated and described herein as embodied in a method for production of a capacitor electrode with a barrier structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
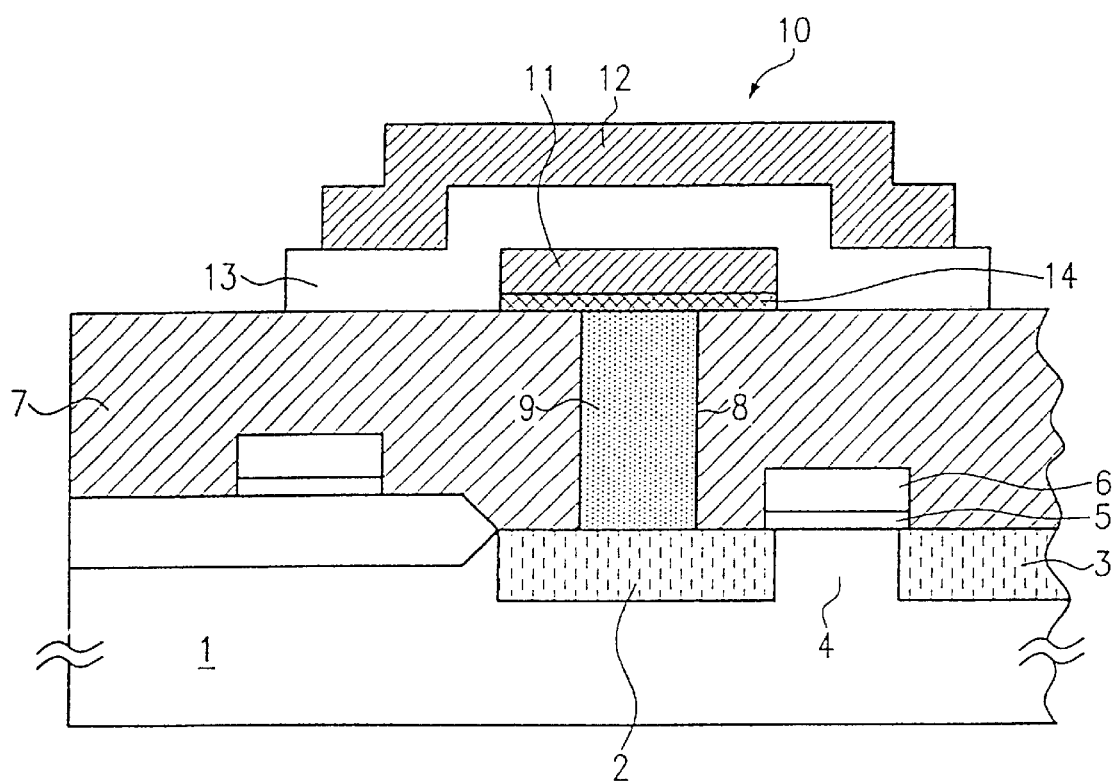
FIG. 1 is a diagram showing the construction of a DRAM memory cell with switching transistor and high-∈ or ferroelectric stacked capacitor.

Referring now to the figures of the drawing in detail and first, particularly, to FIG. 1 thereof, there is shown an N-channel MOS transistor constructed on a, for example, p-doped Si semiconductor substrate 1 by way of conventional processes appertaining to planar technology (layer deposition, layer patterning using lithography and etching techniques, layer doping). An n⁺-doped drain region 2 is separated from an n⁺-doped source region 3 by means of an intervening channel 4 made of substrate material. A thin gate oxide layer 5 lies above the channel 4. A gate electrode 6 is provided on the gate oxide layer 5.

A covering oxide layer 7 comprising a contact hole 8 is deposited above the MOS transistor 2, 3, 4, 5, 6 described. The contact hole 8 is filled with an electrical connection structure 9 (so-called "plug") composed of polysilicon.

The construction and production procedure of the structure shown are known. Instead of the MOS transistor 2, 3, 4, 5, 6 illustrated here, it is also possible to provide another monolithic semiconductor functional element.

A capacitor 10 is formed above the covering oxide layer 7.

The capacitor has a bottom electrode 11, a top electrode 12, and an intervening high-∈ dielectric/ferroelectric 13.

The high-∈ dielectric/ferroelectric 13 may comprise, for example, $Pb(Zr,Ti)O_3$ [PZT], $SrBi_2Ta_2O_9$ [SBT], $SrTiO_3$ [ST], and/or $(Ba,Sr)TiO_3$ [BST] or else other novel perovskite materials. It is usually deposited by an MOD (metal organic deposition), an MOCVD (metal organic chemical vapor decomposition) process or a sputtering process.

After the deposition of the high-∈ dielectric/ferroelectric 13, the latter has to be subjected to heat treatment ("conditioned") in an oxygen-containing atmosphere at high temperatures. In order to avoid an undesirable reaction between the high-∈ dielectric/ferroelectric 13 and the electrodes 11, 12, the latter are produced from Pt (or another sufficiently thermostable and inert material). Furthermore, in order to protect the connection structure 9, a continuous barrier structure 14 with contact layers (not illustrated in FIG. 1) arranged beneath the barrier structure 14 is provided below the bottom Pt electrode 11.

FIGS. 2A–D illustrate a first exemplary embodiment according to the invention for the production of a barrier structure.

Parts which are the same as or comparable to those in the previous figure are identified by the same reference symbols.

A first contact layer 15.1', a second contact layer 15.2' and a barrier layer 14' are deposited above the TEOS covering oxide layer 7. The first contact layer 15.1' may be composed of Ti with a thickness of between 5 and 50 nm, preferably 10 nm, the second contact layer 15.2' may be composed of Ir with a thickness of from 10 to 250 nm, preferably about 50 nm, and the barrier layer 14' may be composed of $IrO_2$ with a thickness of between 20 and 250 nm, preferably about 100 nm. The Ti and Ir contact layers 15.1', 15.2' serve for forming a good electrical contact with the connection structure 9 and the $IrO_2$ barrier layer 14' realizes the diffusion obstacle already mentioned.

The three layers 15.1', 15.2' and 14' are jointly patterned by ion etching. A barrier structure 14.1 and also an Ir contact layer structure 15.2 and a Ti contact layer structure 15.1 are formed in the process. The structure width may lie in the sub-µm range.

Figure 2A:
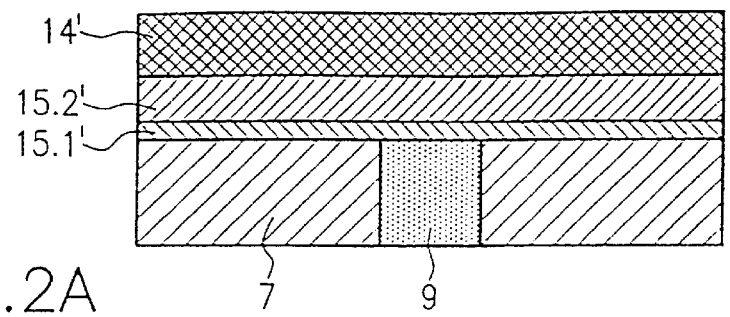
FIGS. 2A–D are diagrammatic sectional illustrations for explaining the production of a buried barrier structure according to a first exemplary embodiment of the invention.
Figure 2B:
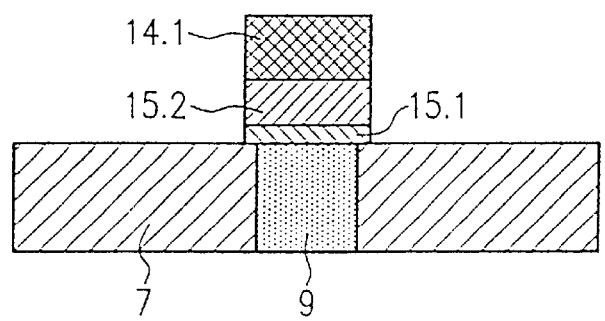
Figure 2C:
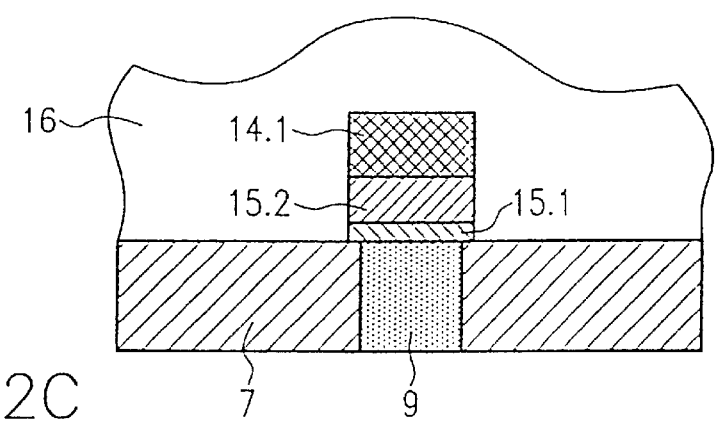
Figure 2D:
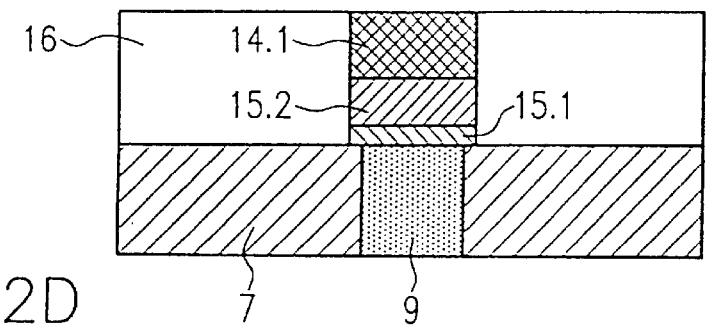

In accordance with FIG. 2C, a barrier incorporation layer 16 is deposited in a next step. Said layer may be, for example, a TEOS oxide layer. A CVD (chemical vapor deposition) method may be used for the deposition. The thickness of the barrier incorporation layer 16 is dependent on the thickness of the barrier structure 14.1 to be buried and may be between 200 and 1500 nm.

The barrier incorporation layer 16 is then polished back by means of CMP. The polishing operation can be stopped on the surface of the $IrO_2$ barrier structure 14.1. A surface of the barrier incorporation layer 16 and of the barrier structure 14.1 with excellent planarity is produced during the CMP planarization.

Figure 3A:
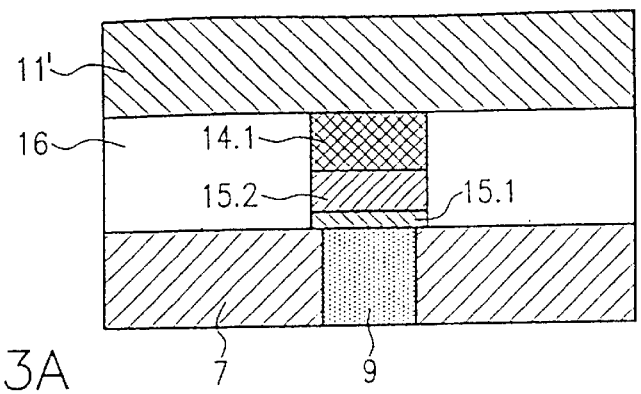
FIGS. 3A–B are diagrammatic sectional illustrations for explaining a first possibility of producing a capacitor electrode above the barrier structure.
Figure 3B:
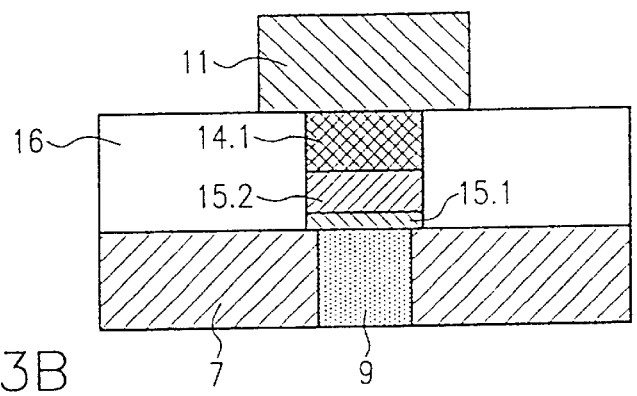

A first possibility for the realization of the bottom capacitor electrode 11 is illustrated in FIGS. 3A–B. An electrode layer 11' is applied to the planarized surface of the barrier incorporation layer 16 and of the barrier structure 14.1 incorporated therein by means of PVD (physical vapor deposition) for example. The Pt electrode layer 11' may have a thickness of from 50 nm to 400 nm.

The bottom capacitor electrode 11 is formed from the Pt electrode layer 11' by ion etching (see FIG. 3B).

Since Pt adheres poorly on the TEOS barrier incorporation layer 16, a thin (5 to 50 nm) $IrO_2$ layer (not illustrated) can be deposited as adhesion layer before the deposition of the Pt electrode layer 11'.

A second possibility for the production of the bottom capacitor electrode 11 will be explained with reference to FIGS. 4A–D. In this case, an electrode incorporation layer 17' is produced on the planarized surface of the barrier incorporation layer 16 (with incorporated barrier structure 14.1). The electrode incorporation layer 17' may likewise be a TEOS layer. Its layer thickness corresponds to the desired thickness of the bottom capacitor electrode 11, i.e. is preferably from 50 to 400 nm.

Figure 4A:
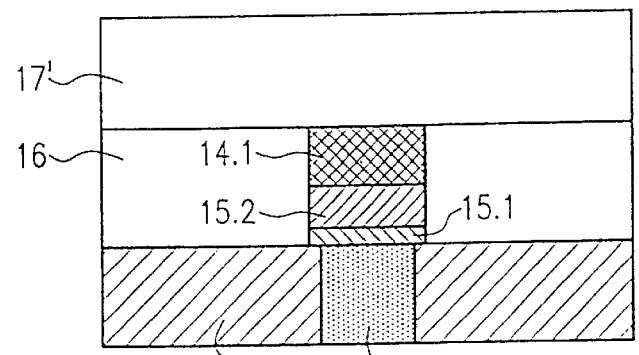
FIGS. 4A–D are diagrammatic sectional illustrations for explaining a second possibility of producing a capacitor electrode above the barrier structure.
Figure 4B:
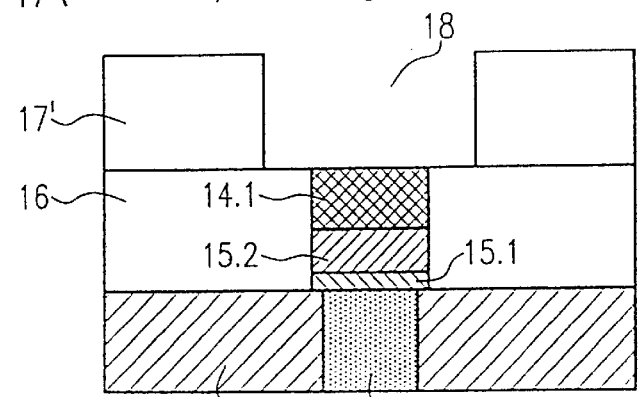
Figure 4C:
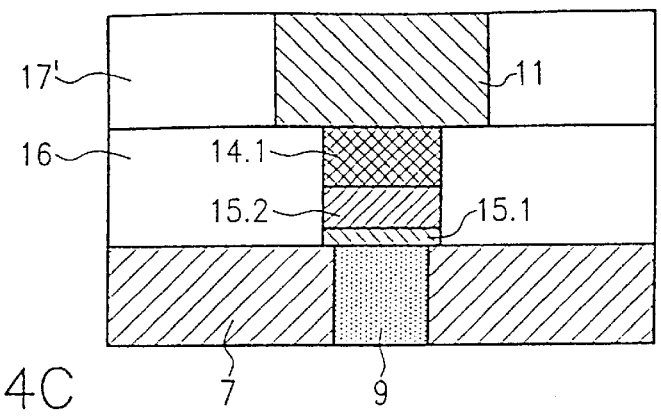

In accordance with FIG. 4B, the electrode incorporation layer 17' is patterned by a lithography and etching step. The top side of the barrier structure 14.1 is uncovered at the bottom of the electrode patterning hole 18 produced in the process.

In a next step, the Pt electrode layer is deposited over the whole area by means of a PVD, CVD or platinizing method. The electrode patterning hole 18 is completely filled with electrode material (Pt) in the process.

The Pt electrode layer is subsequently polished back by means of CMP. In this case, the patterned electrode incorporation layer 17' can be utilized as a stop layer. The result is the arrangement shown in FIG. 4C with finished patterned capacitor electrode 11.

Figure 4D:
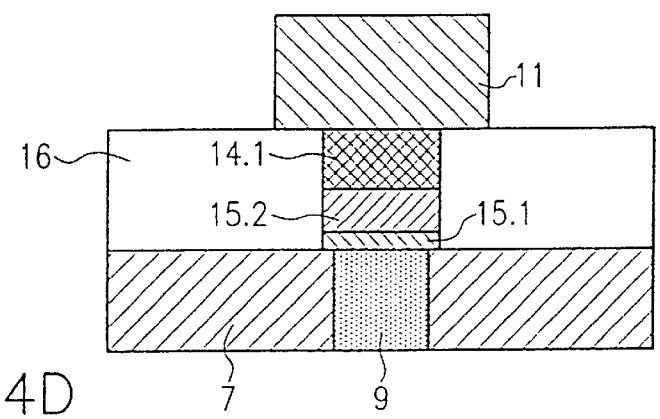

Finally, in accordance with FIG. 4D, the patterned electrode incorporation layer 17' is removed wet-chemically. The bottom capacitor electrode 11 produced in the manner described remains.

In both cases (FIGS. 3A–B and FIGS. 4A–D), the high-∈dielectric/ferroelectric layer 13 and the top capacitor electrode 12 are then applied in subsequent process steps.

A second exemplary embodiment according to the invention is illustrated in FIGS. 5A–E. The starting point is once again a planarized covering oxide layer 7 with a polysilicon connection structure 9. In accordance with FIG. 5A, firstly the polysilicon connection structure 9 is etched back selectively. This produces a depression 19 whose depth is about 50 to 100 nm.

In a next step, there are deposited over the whole area a thin first contact layer (for example made of Ti, thickness 5 to 50 nm) and, above that, a second, thicker contact layer (for example made of Ir, thickness about 50 to 250 nm). The deposition of the contact layers is controlled in such a way that the depression 19 is first partly filled after the deposition of the first contact layer and is completely filled by the deposition of the second contact layer. The two contact layers are then polished back by means of CMP. The covering oxide layer 7 serves as a stop layer here. A surface which is plane over the whole area is produced, a pot-like first contact layer structure 15.1a made of Ti and, within the latter, a second contact layer structure 15.2a made of e.g. Ir being realized above the reduced connection structure 9.

Figure 5A:
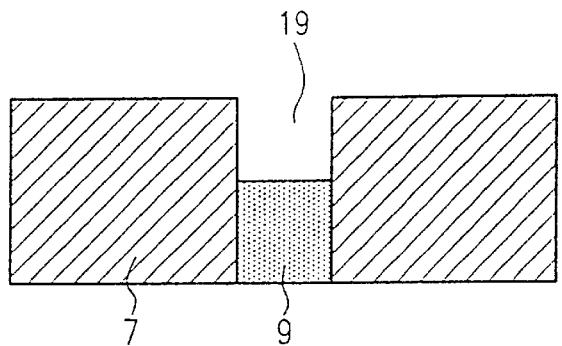
FIGS. 5A–E are diagrammatic sectional illustrations for explaining the production of a buried barrier structure according to a second exemplary embodiment of the invention.
Figure 5B:
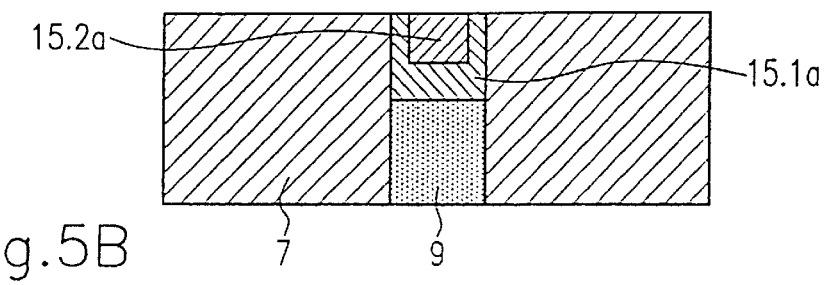
Figure 5C:
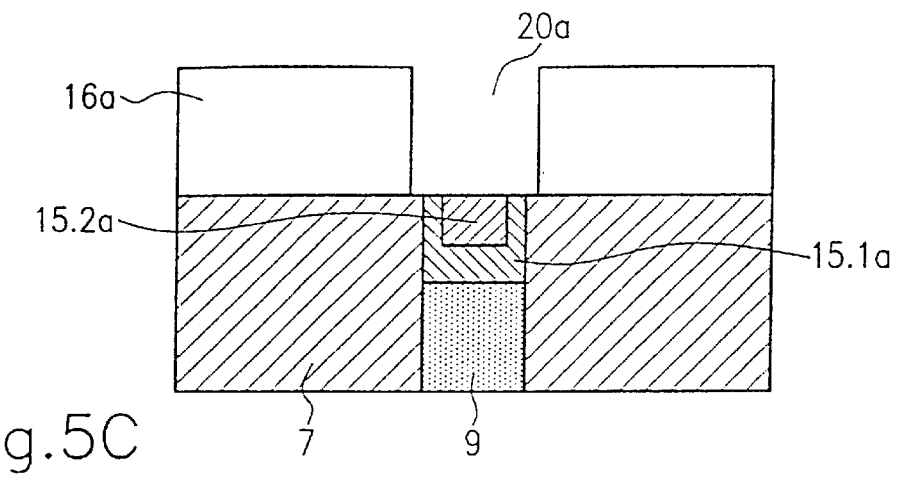

Afterward, a barrier incorporation layer is produced and patterned in accordance with the illustration shown in FIG. 5C, see reference symbol 16a. The patterning is effected by photolithographic and etching processes. The bottom of the barrier patterning hole 20a produced in the process is at least partly formed by the contact layer structures 15.1a and 15.2a.

Figure 5D:
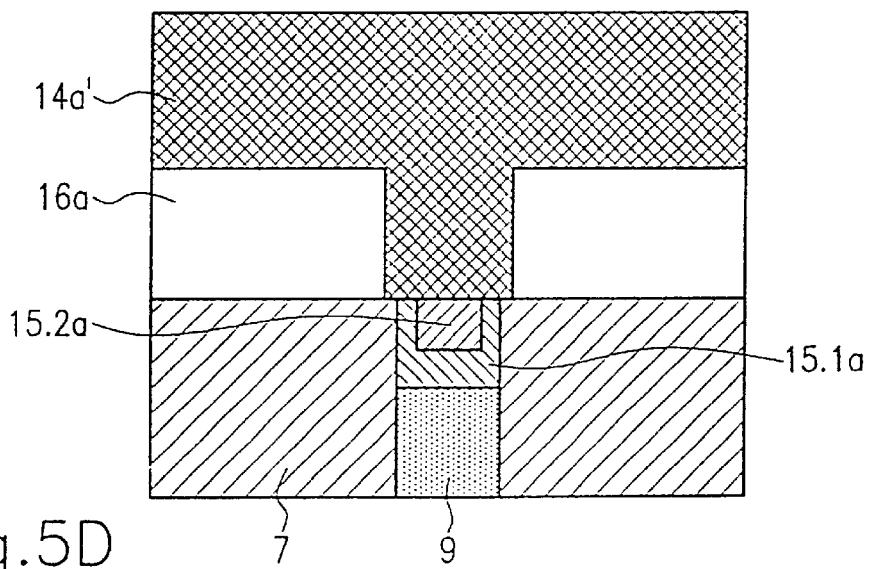

In a further step, a whole-area layer 14' made of barrier material (e.g. $IrO_2$) is deposited, see FIG. 5D.

Figure 5E:
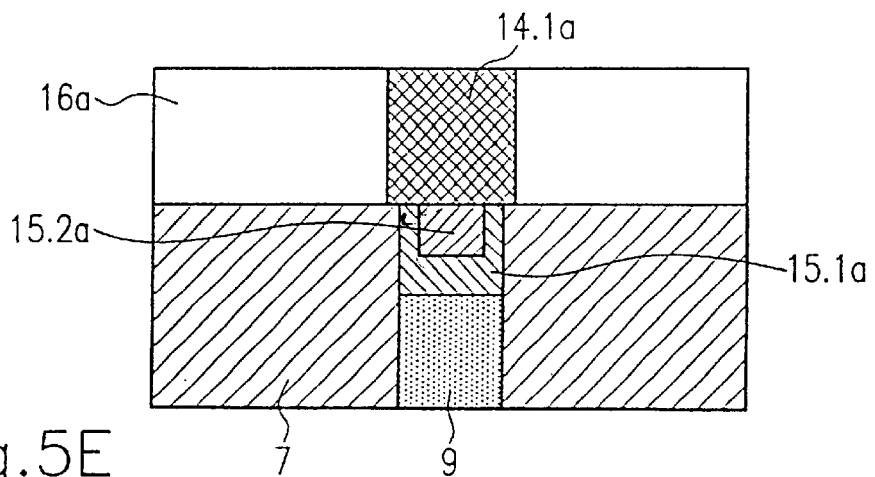

The barrier layer 14a' is subsequently polished back by means of CMP, wherein case the barrier incorporation layer 16a can be used as a stop layer. FIG. 5E shows the planarized barrier incorporation layer 16a with the barrier structure 14.1a incorporated therein.

The deposition and patterning of the bottom Pt capacitor electrode 11 can again be carried out either according to the procedure illustrated in FIGS. 3A–B or according to the procedure illustrated in FIGS. 4A–D.

A third exemplary embodiment for producing a bottom capacitor electrode with an underlying barrier structure is explained with reference to FIGS. 6A–E.

Figure 6A:
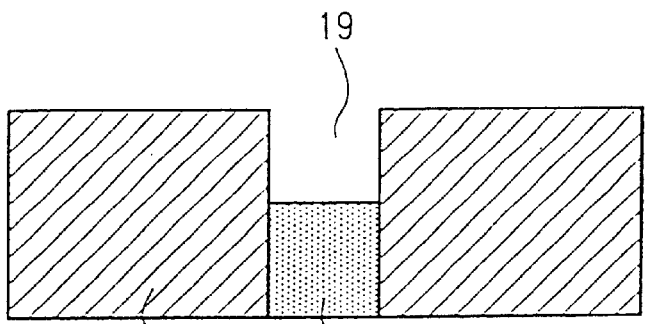
FIGS. 6A–E are diagrammatic sectional illustrations for explaining the production of a buried barrier structure with an overlying capacitor electrode in accordance with a third exemplary embodiment of the invention.

The starting point is the structure of FIG. 6A, already explained with reference to FIG. 5A. Moreover, the subsequent process steps (deposition of the contact layers and CMP planarization) are identical to the process steps already described in connection with FIG. 5B. The result is the construction illustration in FIG. 6B.

Figure 6B:
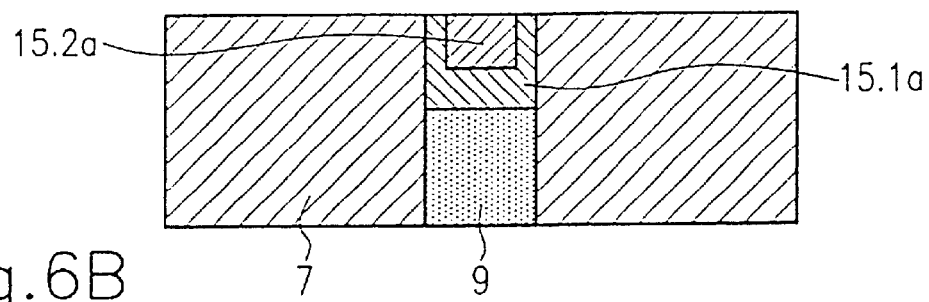

A barrier incorporation layer 16b is applied (still analogously to the secondary exemplary embodiment) to the planarized structure illustrated in FIG. 6B. The barrier incorporation layer 16b may again be a TEOS oxide layer. The barrier incorporation layer 16b is then patterned by photolithography and etching. The structure width of the patterning hole 20b produced in this case corresponds to the desired lateral dimension of the bottom capacitor electrode, i.e. can be greater than the structure width of the patterning hole 20a.

Figure 6C:
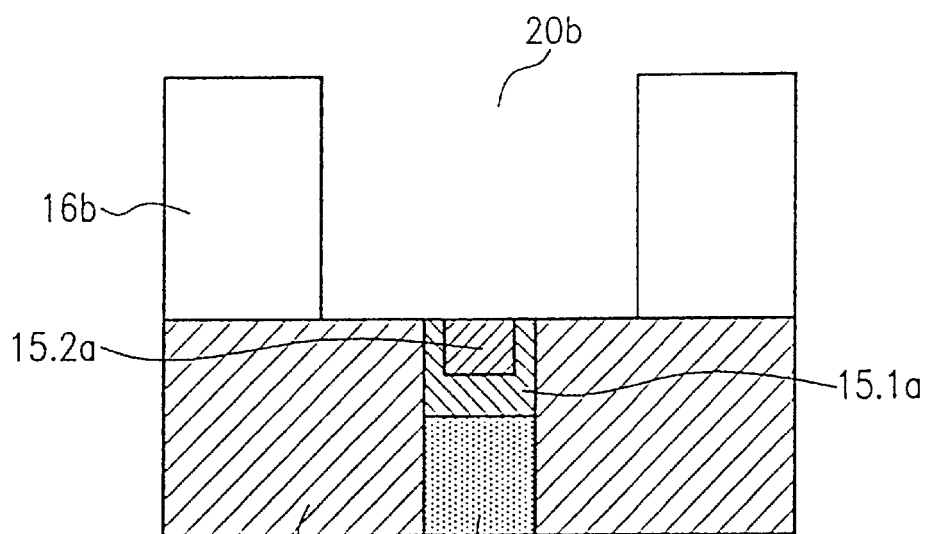
Figure 6D:
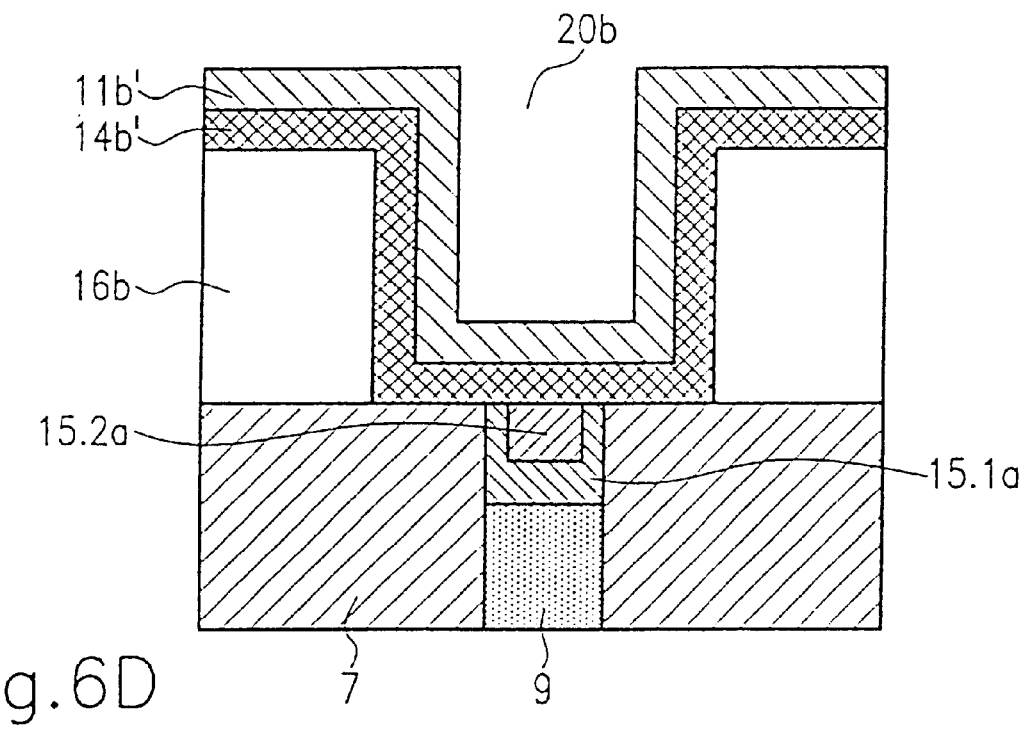

Afterward, in accordance with the illustration of FIG. 6D, firstly a barrier layer 14b' is deposited over the whole area of the structure shown in FIG. 6C. The barrier layer 14b' may again comprise $IrO_2$ and coats the bottom and the side walls of the barrier patterning hole 20b. A thin layer 11b' made of electrode material (e.g. Pt) is subsequently deposited on the barrier layer 14b'. Its layer thickness may be about 50 nm. On account of the small thickness of the electrode material 11b', the barrier patterning hole 20b is not completely filled.

Afterward, both layers, i.e. the electrode material layer 11b' and the barrier layer 14b', are polished back by means of CMP. The barrier incorporation layer 16b can again be utilized as a stop layer. The CMP process can be carried out either as a single-stage process or as a two-stage process. In the case of a single-stage process control, the same polishing agent ("slurry") is used for the polishing of the two layers 11b', and 14b'.

Figure 6E:
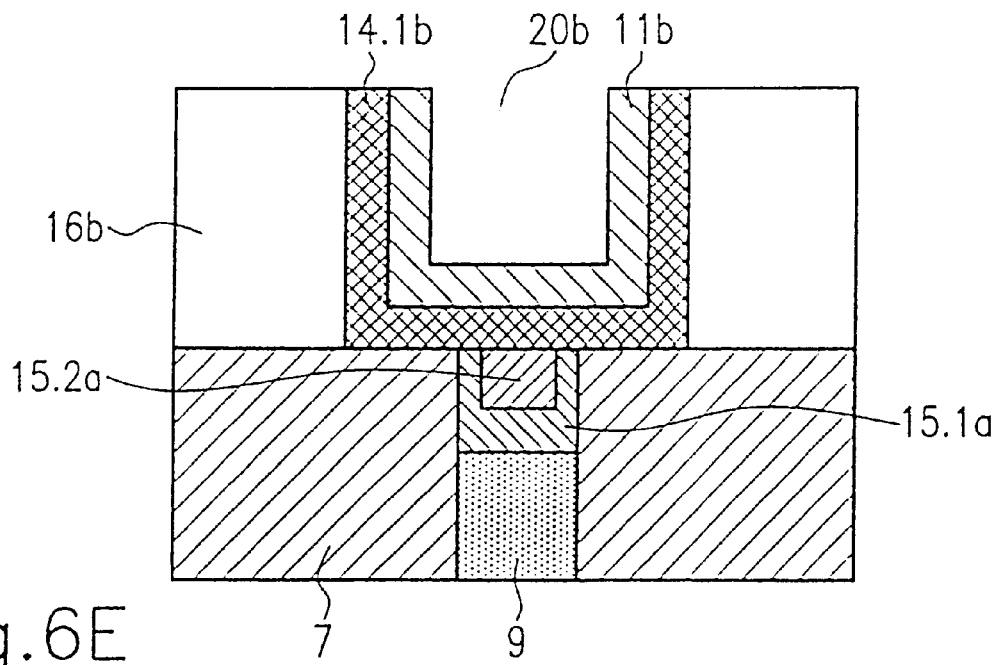

The structure produced after the planarization step is illustrated in FIG. 6E. The barrier structure 14.1b produced from the barrier layer 14b' and also the bottom capacitor electrode 11b formed from the electrode material layer 11b' have the configuration of a pot. The area of the capacitor electrode 11b may approximately correspond to the area of the capacitor electrode 11 in the first two exemplary embodiments and is thus large enough.

In a further step, the ferroelectric/dielectric layer is deposited for producing the capacitor dielectric/ferroelectric 13 and, finally, the top capacitor electrode 12 is produced by a further layer producing and patterning process.

One advantage of the process sequence described in the third exemplary embodiment is that overall only a single lithography/etching step is required. For this reason, the process can be carried out in an extremely cost-effective and time-saving manner.

In all of the exemplary embodiments, for the upper contact layer structure 15.2, 15.2a it is possible to use not only Ir but also other materials such as e.g. Ru, Pd, Re, Os, Rh, Pt, W, Ta, Hf, La, Mo, Nb and alloys thereof. For the lower contact layer structure 15.1, 15.1a, it is possible to use not only Ti but also Cr, V, Co, Ni or silicides thereof. The barrier layer 14', 14a', 14b' may comprise not only $IrO_2$ but also the conductive oxides of the materials mentioned for the upper contact layer structure. Finally, for the electrode material layer 11', it is possible to use not only Pt but also Ir, Ru, Re and alloys of these materials, their oxides and also ternary oxides of the strontium-ruthenium oxide ($SrRuO_3$) type.

What is common to all of the exemplary embodiments is that the application of CMP in the production of the barrier structure 14.1, 14.1a, 14.1b simplifies the process control and furthermore also increases the thermal stability of the barrier structure 14.1, 14.1a, 14.1b.

We claim:

1. A method of producing a capacitor electrode with an underlying barrier structure, the method which comprises:
   depositing a barrier layer on a semiconductor substrate;
   forming a barrier structure from the barrier layer with a lithographic mask and an etching step;
   depositing a barrier incorporation layer covering the barrier structure and surrounding regions;
   removing the barrier incorporation layer with chemical mechanical polishing until the barrier structure is uncovered; and
   forming the capacitor electrode above the barrier structure.

2. The method according to claim 1, wherein the step of forming the capacitor electrode comprises:
   depositing an electrode incorporation layer above the planarized barrier incorporation layer;
   producing an electrode patterning hole, which uncovers the barrier structure, in the electrode incorporation layer with a lithographic mask and an etching step;
   depositing a layer made of electrode material completely filling the electrode patterning hole into and surrounding the electrode patterning hole; and
   forming the capacitor electrode from the electrode material layer by chemical mechanical polishing.

3. The method according to claim 1, wherein said step of forming said capacitor electrode comprises:
   depositing a layer of electrode material above the planarized barrier incorporation layer; and
   forming the capacitor electrode from the electrode material layer with a lithographic mask and an etching step.

4. The method according to claim 1, which comprises forming a contact layer structure below the barrier structure from a layer sequence containing two contact layers.

5. The method according to claim 4, which comprises forming an upper layer of the contact layer structure from Ir.

6. The method according to claim 4, which comprises forming a lower layer of the contact layer structure from Ti.

7. The method according to claim 1, which comprises forming the barrier layer from $IrO_2$.

8. The method according to claim 1, which comprises forming the electrode material layer from Pt.

9. A method of producing a capacitor electrode with an underlying barrier structure, the method which comprises:

forming an insulation layer with a contact hole on a semiconductor substrate;

depositing a barrier incorporation layer on the insulation layer and the contact hole;

producing a barrier patterning hole in the barrier incorporation layer with a lithographic mask and an etching step;

depositing a barrier layer into and surrounding and completely filling the barrier patterning hole;

forming the barrier structure from the barrier layer with a CMP planarization step; and forming the capacitor electrode.

10. The method according to claim 9, wherein the step of forming the capacitor electrode comprises:

depositing an electrode incorporation layer above the planarized barrier incorporation layer;

producing an electrode patterning hole, uncovering the barrier structure, in the electrode incorporation layer with a lithographic mask and an etching step;

producing a layer of electrode material completely filling the electrode patterning hole in and surrounding the electrode patterning hole; and forming the capacitor electrode from the electrode material layer by chemical mechanical polishing.

11. The method according to claim 9, wherein the step of forming the capacitor electrode comprises:

depositing a layer of electrode material above the planarized barrier incorporation layer; and forming the capacitor electrode from the electrode material layer with a lithographic mask and an etching step.

12. The method according to claim 9, which comprises:

forming the barrier layer to line a bottom and a wall of the barrier patterning hole while maintaining a depression;

depositing an electrode material layer above the barrier layer; and forming the capacitor electrode from an overlying electrode material layer during the CMP planarization step.

13. The method according to claim 9, which comprises forming a contact layer structure below the barrier structure from a layer sequence containing two contact layers.

14. The method according to claim 13, which comprises forming an upper layer of the contact layer structure from Ir.

15. The method according to claim 13, which comprises forming a lower layer of the contact layer structure from Ti.

16. The method according to claim 9, which comprises forming the barrier layer from $IrO_2$.

17. The method according to claim 9, which comprises forming the electrode material layer from Pt.

* * * * *